US007514188B2

(12) United States Patent
Hoffmann et al.

(10) Patent No.: US 7,514,188 B2
(45) Date of Patent: Apr. 7, 2009

(54) PROCESS FOR PROVIDING MARKING ON SECURITY PAPERS

(75) Inventors: Patrik Hoffmann, Epalinges (CH); Tristan Bret, Lausanne (CH); Vincent Moreau, Lausanne (CH)

(73) Assignee: KBA-Giori S.A., Lausanne (CH)

( * ) Notice: Subject to any disclaimer, the term of this patent is extended or adjusted under 35 U.S.C. 154(b) by 263 days.

(21) Appl. No.: 10/566,793

(22) PCT Filed: Aug. 5, 2004

(86) PCT No.: PCT/CH2004/000492

§ 371 (c)(1),
(2), (4) Date: Jan. 31, 2006

(87) PCT Pub. No.: WO2005/011992

PCT Pub. Date: Feb. 10, 2005

(65) Prior Publication Data

US 2006/0197333 A1 Sep. 7, 2006

(30) Foreign Application Priority Data

Aug. 5, 2003 (EP) .................................. 03405576

(51) Int. Cl.
*G03F 7/00* (2006.01)
*G03C 3/00* (2006.01)

(52) U.S. Cl. ...................... 430/10; 430/495.1; 430/346; 430/616

(58) Field of Classification Search ................... 430/10, 430/346, 495.1, 616
See application file for complete search history.

(56) References Cited

U.S. PATENT DOCUMENTS 4,352,706 A 10/1982 Miller
5,972,546 A * 10/1999 Bjelkhagen .................. 430/10
7,252,239 B2 * 8/2007 Braun ........................ 235/488

FOREIGN PATENT DOCUMENTS

DE 100 08 851 8/2001
WO WO 99/65699 A 12/1999

OTHER PUBLICATIONS

Yonezawa, Y., et al.: "Photo-induced formation of Gold Metal Film from Metal Salt of Chitosan" Chemistry Letters., 1994, pp. 355-358, Chemical Society of Japan. Tokyo, JP.
Y. Yonezawa, I. Kawabata, and T. Sato; Photochemical Formation of Colloidal Gold Particles in Chitosan Films, Ber. Bunsenges. Phys. Chem. 100, 39-45 (1996) No. 1., Division of Molecular Engineering, Graduate School of Engineering, Kyoto University, Yoshida, Kyoto 606, Japan.

* cited by examiner

*Primary Examiner*—Amanda C. Walke
(74) *Attorney, Agent, or Firm*—Clifford W. Browning; Krieg DeVault LLP

(57) ABSTRACT

A process for providing a security paper, in particular a banknote, with a coloured marking, comprising providing a photosensitive preparation on a portion of said document and submitting at least selected areas of said portion to a light beam, wherein said preparation is capable of forming a film on said portion and comprises a substance capable of producing colloidal metal particles under the effect of UV irradiation, and said areas are irradiated by means of an UV-light beam.

29 Claims, 2 Drawing Sheets

PROCESS FOR PROVIDING MARKING ON SECURITY PAPERS

Applicants claim foreign priority benefits under Title 35 U.S.C. §119 of European Patent Application No. 03405576.4 filed Aug. 5, 2003.

The present invention belongs to the field of the processes intended to provide security documents with markings.

The present invention concerns more specifically a process for providing a security paper, in particular a banknote, with a coloured marking, comprising providing a photosensitive preparation on a portion of said document and submitting at least selected areas of said portion to a light beam.

The term "security documents" primarily designates here banknotes, but also designates documents of any kind having financial value, such as cheques, lottery tickets, title deeds and the like or identity documents, such as passport, ID cards, driving license and the like.

The term "marking" designates here any sign, readable either by the human eye or by a specific machine. Such markings comprise in particular variable data, each security document having an individualizing identity-marking offering improved security against copies or falsification. Identity markings include for example serial numbers, code-bars, geometrical figures, punchings and the like, but are not limited to the same. They may be checked as far as quality parameters like colour shade, thickness, consistency and the like are concerned or as long as the individual information such as serial numbers or code bar may be compared with information stored in a file.

Common practice in the security paper printing industry is to associate more than one printing process on a same security paper, that is to say to submit a security paper sheet to a plurality of different printing processes so as to make forgery more difficult. As examples of such processes used in the security printing industry, and especially for banknotes, one can cite offset printing, screen printing, foil application, intaglio printing, flexography printing, letterpress printing.

WO 99/65699 discloses a method of providing an image on a substrate comprising a) providing an adhesive on the substrate in a pattern corresponding to an image, b) depositing a metal powder with a particle size range 0.1-100 μm on the adhesive, and c) embossing an optically variable effect generating structure into the metal powder layer.

U.S. Pat. No. 4,352,706 discloses a process for applying by lamination two overlapping films of metallic particles onto a substrate, thus forming a latent metallic image.

These processes are suitable for providing the same image, with a metallic mirror aspect, onto series of security documents, but are not suitable for providing an identity marking on a security document.

Document DE 100 08 851 discloses a process of the above-mentioned type. A laser beam produces a substantially black marking within a photosensitive layer. The photosensitive layer is covered by an optically variable layer, for example a layer containing reticulated liquid crystal polymers. The visual aspect of this layer varies according to the angle under which the security paper is viewed, due to the contrast forwarded by the under-laying black laser-printed layer. A drawback of this method is that forgery of such markings is no more an extreme burden: laser printing in black colour by thermochemical effect is actually a commonly available technology and may be effected with relative freedom upon setting the operating parameters. Applying liquid crystal polymer layers is also state of the art.

It is thus desirable to offer a marking process whose visible or measurable results vary tremendously when operative parameters like the light dose or the amount of photosensitive material, and the like, are modified by the operator. Furthermore, determining the appropriate precise operative conditions by means of reverse engineering assays should be a tedious burden for a forger having merely understood the basic principles of the marking process used by the authorized security paper manufacturer.

These aims are achieved by means of a process of the above defined type wherein the photosensitive preparation is capable to form a film on the portion that shall be marked on the security paper, wherein said preparation comprises a substance capable of producing colloidal metal particles under the effect of a UV irradiation and wherein the areas to be irradiated are irradiated by means of a UV-light beam so as to produce said colloidal particles.

In the framework of the invention, a preparation comprising a substance capable of producing colloidal semiconducting particles under the effect of a UV irradiation may be used equally.

Preferably, said preparation is substantially transparent before said irradiation and comprises a film forming polymer and a precursor of metal or semiconducting particles. Among metal particles, Au, Ag or Cu particles are preferred. Particularly preferred is a preparation in form of a printable transparent ink or varnish.

Small metal particles have optical properties that vary tremendously, with increasing size, from those of isolated atoms, clusters (up to several hundred atoms), colloids (typically in the size range 1-200 nm), to the bulk materials. Colloidal metal particles of gold, silver or copper exhibit both beautiful and very variable colours. There have been a number of works on the fabrication of noble metal—polymer composite films with a view to produce optical mirror surfaces. In these processes, the operative parameters, in particular the amounts of photosensitive precursor substances, for example silver salts of high molecular weight carboxylic acids or nitrocellulose—polyvinyl alcohol films containing ammonium tetrachloroaurate, are set so as to produce the typical silvery or golden aspect of the corresponding polished metal surfaces.

The present inventors have now found that it is possible to obtain very variable colours, like red, brown, blue or green, varying according to operative conditions like the amount of metal per surface unit, the thickness of the film or the light dose. Furthermore, the colours may be different if the film is viewed by reflection or by transparency through the security paper. Thus, a forger has many parameters to determine.

Furthermore, the inventors have found that after the photolysis step, a shade of colour develops and varies during several days before it stabilizes. Thus, it is a tedious burden for a forger to determine the correct operative parameters upon reverse engineering assays, since the results of such trials are not available immediately.

A particularly preferred substance within the framework of the present invention is a chloroauric acid salt of chitosan.

In one embodiment, the process may comprise the steps of applying a chitosan solution onto the portion of the security paper to be marked and drying said portion, so as to form a film having a thickness of between 0.5 and 20 μm depending upon the printing processes, preferably of between 2 and 10 μm; applying a solution of chloroauric acid onto said chitosan film and drying the impregnated portion, preferably in the dark.

According to an alternative embodiment, the process may comprise the steps of combining a chitosan solution and a chloroauric solution in a molar ratio $HAuCl_4$/chitosan monomeric unit of between 0.1 and 1; applying said combined solution onto said portion of said security paper and drying said portion in the dark; eventually repeating the two preceding steps so as to form a film having a thickness of between 0.5 and 20 μm, preferably of between 2 and 10 μm.

Appropriate light for effecting the irradiation step should have wavelengths between 150 and 400 nm, in particular a wavelength between 190 nm and 310 nm. An appropriate light source may be chosen from among UV-lamps and UV emitting lasers. Among suitable lasers are excimer lasers. Other lasers, basically solid state lasers emitting in the IR, may be used in frequency-tripled or frequency-quadrupled embodiments, for example a frequency-quadrupled Nd:YAG Laser, so as to produce an appropriate coherent UV beam.

A preferred writing method is a beam deflection method via two galvanometric mirrors and a lens system offering, by means of a piloting computer software, a large variety of marking possibilities.

An other writing method uses a plurality of small precisely oriented mirrors creating an image when they reflect an enlarged UV-beam. Since this method permits to print simultaneously several signs, it is faster to practice than a method using piloted moving mirrors.

According to a particularly preferred embodiment, a diffractive network is reported into the photosensitive film: thereby, iridescent effects are superimposed to the basic marking itself.

In one embodiment, two laser beams interfere on the surface of the film, a phase mask being interposed upwards in each beam. In an other embodiment, a mask is interposed in one laser beam only.

In an alternative embodiment, two laser beam spots may be superposed under a certain angle by an appropriate arrangement in their focus, or at slightly defocused planes to form a spot containing an interference pattern. This spot reports the diffraction grating into the photosensitive material. An appropriate scanning unit displaces the spot that contains the interference pattern laterally over the surface of the film to built up step by step a larger zone where the diffraction grating is reported.

Finally, a covering layer may be applied onto the photosensitive film after the UV irradiation for protecting and stabilizing purposes, said covering layer having a high absorption in the UV range and being substantially transparent in the visible light region.

In an embodiment, the amount of photosensitive preparation per surface unit provided to said document is smaller than the amount that is necessary to produce a metallic mirror aspect.

In another embodiment, after development of the marking, the unreacted precursor substance is degraded, for example photolytically at an appropriate energy fluence.

Alternatively a reticulating photopolymerisation may be used for setting the material and preventing further development of colloidal particles.

Further particularities and advantages of the inventive process will appear to those skilled in the art from the following description of a preferred embodiment, in connection with the drawings, wherein.

Figure 1:
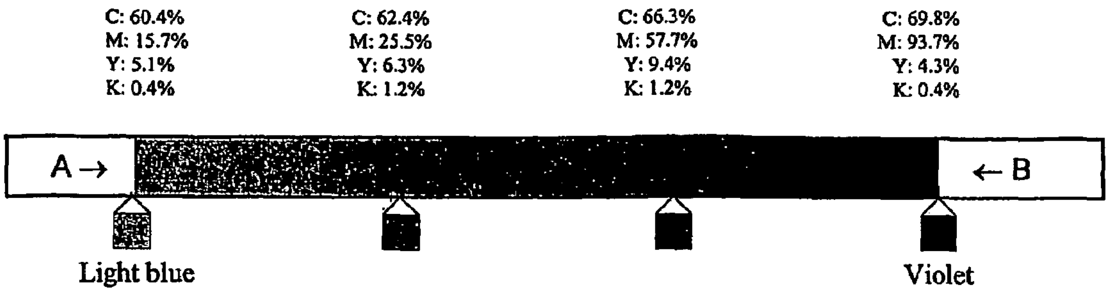
FIG. 1 illustrates the effect of increasing light dose on the colour shade of a sample, the colour indications corresponding to an approximation in the CMYK system.

The following results exemplify various aspects of a film including a preferred substance, namely a chloroauric acid salt of chitosan, obtainable within the framework of the invention. Primary experimental work was performed using glass plates (26×76 mm) as a substrate for the film. Further work was done using cotton based security paper samples with high roughness (~30 μm), that is commonly used in the printing of banknotes.

Chitosan with an average molecular weight of 600'000 was purchased from Fluka (Fluka Biochemica 22743). 100 mg chitosan were mixed with 10 ml distilled water and 0.2 ml acetic acid (Fluka) and dissolved therein, upon maintaining the mixture during 1 h 30 in an ultrasonic bath.

$HAuCl_4$ (purchased from ABCR) was dissolved in deoxygenated distilled water at a concentration of about 30 mg/ml. The solution is stored tightly sealed, in the absence of oxygen.

For experiments using glass plates as substrates, the two solutions were mixed in various proportions, combining each time an amount of 600 mg chitosan with n aliquots of 30 mg of $HAuCl_4$ as indicated in Table 1. The combined solution is thereafter applied onto the glass plate and dried in the dark. The applying/drying steps may be repeated to increase the total thickness of the film, and the amount of gold per surface unit.

TABLE 1

| Sample designation | Amount of chitosan (mg) | Amount of gold salt (mg) | $C_{average}$ (% total weight) |
|---|---|---|---|
| 1 * Au | 600 ± 20 | 30 ± 10 | 4.79 ± 1.66 |
| 3 * Au | 600 ± 20 | 90 ± 10 | 13.07 ± 1.64 |
| 6 * Au | 600 ± 20 | 180 ± 10 | 23.10 ± 1.58 |
| 10 * Au | 600 ± 20 | 300 ± 10 | 33.35 ± 1.48 |
| 20 * Au | 600 ± 20 | 600 ± 10 | 50.01 ± 1.25 |

Alternatively, a pure chitosan solution may be applied onto the glass plate in an appropriate amount so as to obtain after drying a film of the desired thickness. The thickness and profile of the film may be checked by using an Alpha Step 200 profilometer (Tencor Instruments). Thereafter, a definite amount of $HAuCl_4$ solution may be applied onto said film, the gold precursor diffuses within the chitosan matrix and the whole is dried in the dark.

The irradiation experiments are performed with a LPX 100 KrF excimer laser (Lambda Physics) emitting pulses at 248 nm. The voltage of the laser is adjusted between 16 kV and 24 kV. The energy fluence of the laser may be adjusted between 10 mJ/cm$^2$ and 40 mJ/cm$^2$. The repetition rate may be adjusted between 1 and 50 Hz. The light dose is here defined as the number of pulses received by the sample x the energy fluence per pulse.

The structure of the deposited films was studied at the nanoscopic scale by means of transmission electron microscopy (TEM, Philipps C300) and scanning electron microscopy (SEM, Philipps XL30FEG). 200 mesh grids covered with a carbon film, received the chitosan-gold preparation.

Study of a sample of the type 1*Au shows that before irradiation, the chitosan film contains on one hand colloidal particles of about 5 nm and aggregates of the same of about 80 nm. After irradiation, the colloidal particles grow in bulk. The size distribution may be widespread but there are practically no more colloidal particles with diameters less than 10 nm.

On the contrary, the study of a sample of the type 10*Au shows that before irradiation, the film contains colloidal particles of various sizes. Immediately after irradiation, colloidal particles larger than 10 nm have disappeared and the average size of the particles is between 3-5 nm. But, in the course of time, the particles grow again to sizes generally of between 10-40 nm. The growth, during which various colour shades develop, generally extends over a week and, for some samples, extends up to 20 days.

Recording of absorption spectra of the samples in the visible and UV regions shows that chitosan itself has a very low absorption at wavelengths above 350 nm. Before irradiation, the gold precursor compound has a very low absorption in the visible region but absorbs in the UV; after irradiation, broad absorption bands appear in the visible with maxima located between 500 and 600 nm. Minima of absorption are located between 400 and 500 nm. The position and intensity of these bands are representative of the structure and population of colloidal particles. The spectra are strongly dependent upon operating parameters and time. One observes a blue shift of the absorption bands upon increasing the light dose, but on the other hand a red shift of the bands upon time after irradiation.

At the macroscopic level, these phenomena appear in the form of various and variable colours. FIG. 1 summarizes the observed colours for a 10*Au sample in function of the light dose, after full development of the colours. One may observe that below a lower threshold A of light dose, on the left side of the figure, the colours do not develop. Above a second upper threshold B, on the right side of the figure, the amount of energy is sufficient to destroy the film and ablation occurs.

Figure 2:
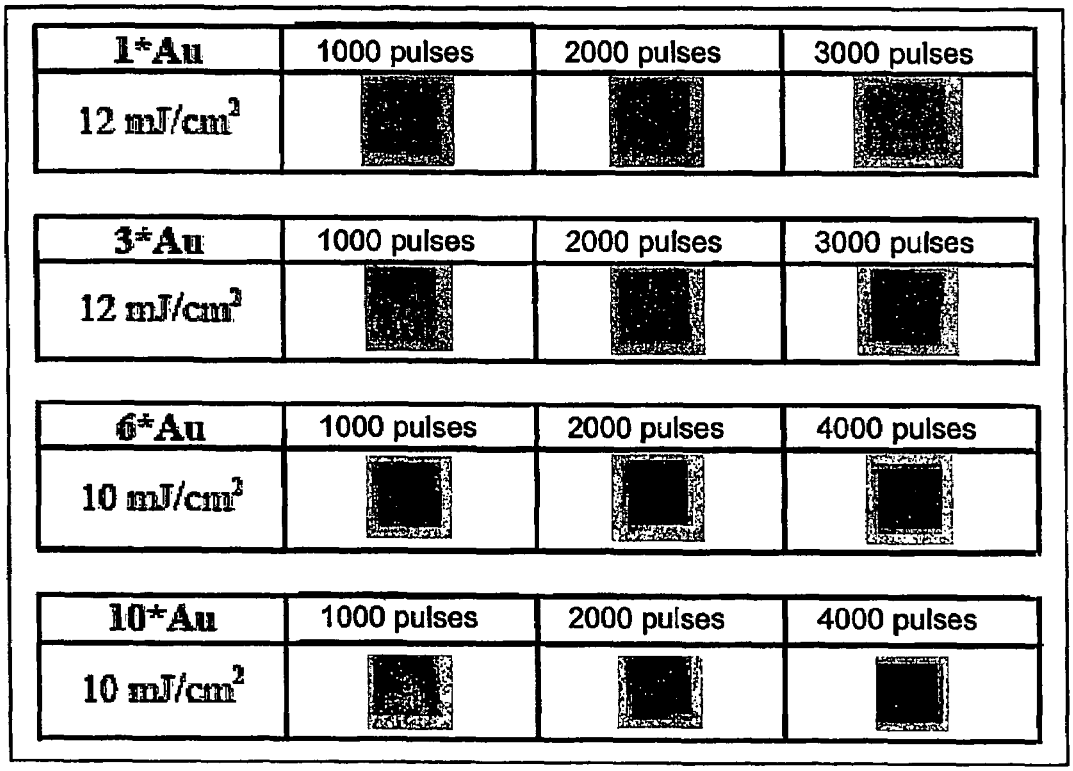
FIG. 2 is a table illustrating the effect of variable light doses on the colour shades of samples of varying gold concentration.

FIG. 2 shows by means of squares of more or less deep grey colour exemplary effects of increasing light dose and increasing Au concentration. For samples 1*Au and 3*Au, upon increasing light dose, the colour shifts from light yellow to brown yellow. For the 6*Au sample, a brown-grey colour appears just after irradiation for all light doses. For low light doses, the film gets blue-green after 1-2 days and dark blue after one week. At high light dose, the colour of the film shifts to violet and dark violet after one week. For the 10*Au sample, the colours are more or less similar to the 6*Au sample. But a mirror appearance appears at low light dose and to less extent at high light doses.

The thickness of the film has a strong effect on the colour: for a 4*Au sample irradiated by 1'1000 pulses at 50 mJ/cm$^2$, a sandyish brown appears for a film having a thickness of 500 nm whereas an intense red brown appears for a film having a thickness of 2'800 nm.

Figure 3:
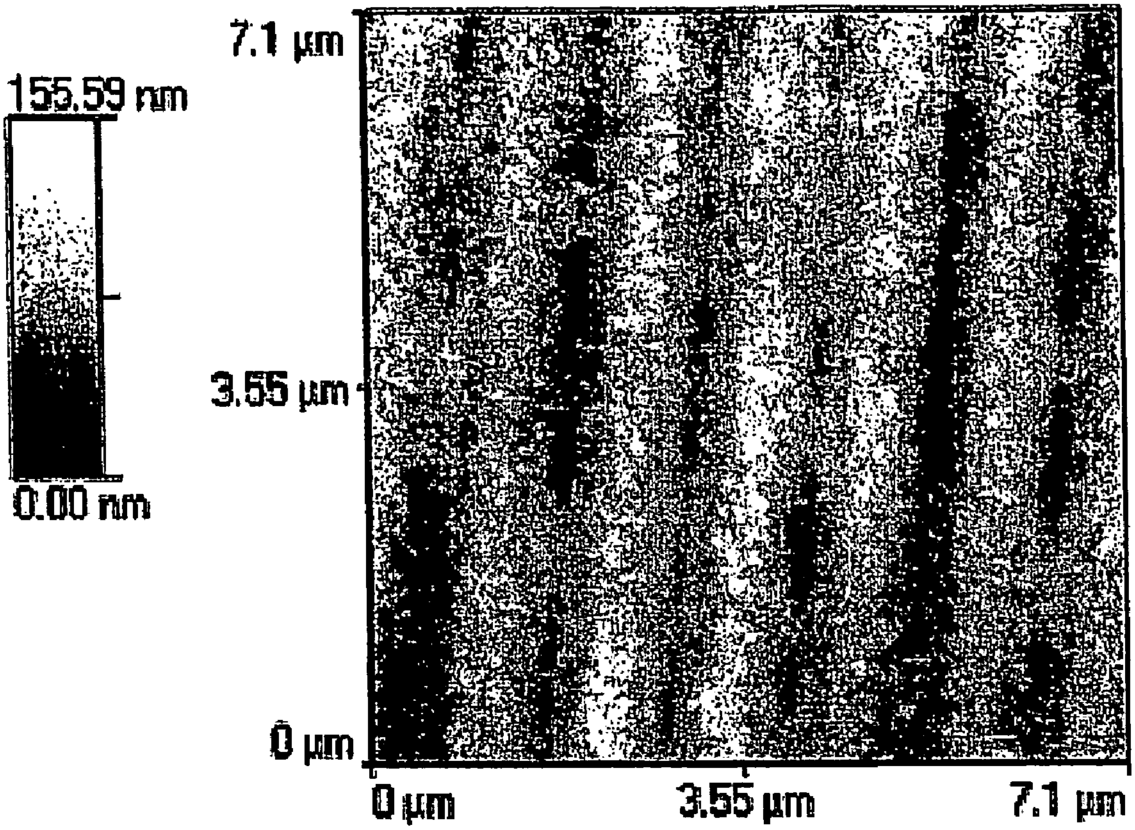
FIG. 3 is an AFM micrography of a sample after irradiation through an optical network.

The inventors have further found that the irradiation produces not only coloured phenomena within the film, but also induces a settling of the surface of the film. This shrinking of the film is not a destructive ablation, which appears only above a high threshold of irradiation. The compacting of the film thickness increases with the number of pulses at constant fluencies, until a maximum shrinking is attained. Advantage was taken from this phenomenon for transferring a diffractive network into the chitosan film. The laser beam was directed onto the chitosan film via an optical network with a pitch of 1 μm machined in quartz. The periodically additive and subtractive light interferences produce a periodically variable compacting of the chitosan film. FIG. 3 shows a photomicrograph of a 10*Au sample irradiated by 500 pulses at 20 mJ/cm$^2$ demonstrating that the optical network has been transferred within the film. Similar results have been observed using cotton based security paper samples with high roughness (~30 μm), that is commonly used in the manufacture of banknotes, instead of glass plates as substrate. For these experiments, a solution containing the photosensitive substance is applied onto the paper and dried in the dark to form an uniform film. Films with different gold concentrations and thicknesses are formed by applying amounts of material differing in precursor substance concentration or by repeating the applying/drying steps several times to increase the film thickness.

The irradiation experiments are performed with a frequency-quadrupled Nd:YAG Laser emitting pulses at 266 nm. The energy fluence of the laser may be adjusted up to 90 mJ/cm$^2$ at a repetition rate between 1 and 10 Hz.

In the irradiated areas of the samples, various colour shades develop within several days, depending upon the operative conditions.

In one assay, a diffraction grating was reported into the photosensitive material by superposing two laser beams under an appropriate angle on the paper substrate so as to form an interference pattern on the surface of the film. A phase mask can be interposed upwards in each beam and projected onto the surface of the film. Alternatively, a phase mask is interposed in the laser beam before splitting it up.

In summary, the assay results show that very variable colour shade effects may be obtained on a security paper by printing on said paper a film forming preparation that comprises a substance capable of producing colloidal metal particles under the effect of a UV light emission. The most important parameters determining the colour shade effect appear to be the concentration of metal in the film, the thickness of the film and the total light dose of the irradiation. The two individual factors determining the total light dose, namely the repetition rate of the pulses and the energy fluence of each pulse appear to be determining to a lesser extent. It is particularly worthwhile to note that at relatively high metal concentrations, a metallic mirror-like aspect is viewed in reflection, whereas in transmission through the paper, a different colour, generally ranking from green to blue or violet, is observed. Finally, an iridescent effect may be superimposed to the basic colour effect upon reporting optically a diffractive network within the matrix film.

The invention claimed is:

1. A process for providing a security document with a coloured marking, comprising providing a photosensitive preparation on a portion of said document and submitting at least selected areas of said portion to a light beam, wherein said preparation is capable of forming a film on said portion and comprises a substance capable of producing colloidal metal particles or colloidal semiconducting particles under the effect of UV irradiation, and wherein said areas are irradiated by means of an UV-light beam so as to produce said colloidal particles.

2. A process as claimed in claim 1, wherein said preparation is an ink or varnish, is substantially transparent before said irradiation and comprises a film forming polymer and a precursor of colloidal metal particles or colloidal semiconducting particles.

3. A process as claimed in claim 2, wherein said precursor is a precursor of Au, Ag or Cu colloidal particles.

4. A process as claimed in claim 1, wherein said preparation is an ink or varnish, is substantially transparent before said irradiation and comprises a film forming polymer and a precursor of colloidal metal particles or colloidal semiconducting particles, and wherein said film forming polymer is a polysaccharide or polypeptide and said precursor is an inorganic gold salt or acid.

5. A process as claimed in claim 4, wherein said film forming polymer is chitosan and said precursor is a chloroauric acid.

6. A process as claimed in claim 1, wherein the step of providing a photosensitive preparation on a portion of said security document comprises the steps of a) applying a chitosan solution onto said portion of said security document and b) drying said portion, so as to form a film having a thickness of between 0.5 and 20 μm c) applying a solution of chloroauric acid to said portion, and d) drying said portion in the dark.

7. A process as claimed in claim 1, wherein the step of providing a photosensitive preparation on a portion of said security document further comprises the steps of a') combining a chitosan solution and a chloroauric acid solution in a molar ratio $HAuCL_4$/chitosan monomeric unit of between 0.1 and 1 b') applying said combined solution onto said portion of said security document and c') drying said portion in the dark d') eventually repeating steps b' and c' so as to form a film having a thickness of between 0.5 and 20 μm.

8. A process as claimed in claim 1, wherein said irradiation is performed by means of a pulsed excimer laser.

9. A process as claimed in claim 1, wherein said irradiation is performed by means of a frequency-multiplied solid state Laser.

10. A process as claimed in claim 1, wherein the irradiation is performed by a beam deflection method via a plurality of mirrors.

11. A process as claimed in claim 10, wherein said irradiation is performed via a system of a beam scanning system.

12. A process as claimed in claim 1, wherein a diffractive network is reported into said film.

13. A process as claimed in claim 1, wherein a covering layer is applied onto said film after said irradiation, said covering layer having a high absorption in the UV range and being substantially transparent in the visible light region.

14. A process as claimed in claim 1, and further comprising a reticulating step after development of said marking.

15. A process as claimed in claim 10, providing an identity marking to said security document.

16. A process as claimed in claim 11, providing an identity marking to said security document.

17. A process as claimed in claim 12, providing an identity marking to said security document.

18. A process as claimed in claim 13, providing an identity marking to said security document.

19. A process as claimed in claim 14, providing an identity marking to said security document.

20. A process as claimed in claim 1, wherein the security document is a banknote.

21. A process as claimed in claim 7, wherein, in step d', a film having a thickness of between 2 and 10 μm is formed.

22. A process as claimed in claim 10, wherein said irradiation is performed via a system of piloted galvanometric mirrors.

23. A security document comprising a photosensitive preparation provided on a portion of the document, wherein said preparation is capable of forming a film on said portion and comprises a substance capable of producing colloidal metal or semiconducting particles under the effect of UV irradiation.

24. A security document according to claim 23, wherein said preparation is an ink or varnish, is substantially transparent before irradiation, and comprises a film forming polymer and a precursor of colloidal metal particles or colloidal semiconducting particles.

25. A security document according to claim 24, wherein said precursor is a precursor of Au, Ag or Cu colloidal particles.

26. A security document according to claim 24, wherein said preparation is an ink or varnish, is substantially transparent before said irradiation and comprises a film forming polymer and a precursor of colloidal metal particles or colloidal semiconducting particles, and wherein said film forming polymer is a polysaccharide or polypeptide and said precursor in an inorganic gold salt or acid.

27. A security document according to claim 26, wherein said film forming polymer is chitosan and said precursor is a chloroauric acid.

28. A security document according to claim 23, wherein the amount of photosensitive preparation per surface unit is smaller than the amount that is necessary to produce a metallic mirror aspect.

29. A security document according to claim 23, comprising a marking or a diffractive network formed by UV irradiation of said preparation and a covering layer applied after UV irradiation onto said film, said covering layer having a high absorption in the UV range and being substantially transparent in the visible light region.

* * * * *

UNITED STATES PATENT AND TRADEMARK OFFICE

CERTIFICATE OF CORRECTION

PATENT NO. : 7,514,188 B2
APPLICATION NO. : 10/566793
DATED : April 7, 2009
INVENTOR(S) : Patrik Hoffmann et al.

It is certified that error appears in the above-identified patent and that said Letters Patent is hereby corrected as shown below:

On the title page, item (73) “Assignee,” please delete “KBA-Giori S.A.” and insert in lieu thereof -- KBA-GIORI S.A. --.

Column 5, line 41, delete “irradiated by 1'1000 pulses” and insert -- irradiated by 1'000 pulses --.

Signed and Sealed this

Second Day of June, 2009

JOHN DOLL
*Acting Director of the United States Patent and Trademark Office*